US008174311B2

(12) United States Patent
Jos

(10) Patent No.: US 8,174,311 B2
(45) Date of Patent: May 8, 2012

(54) SWITCHING AMPLIFIER

(75) Inventor: Rik Jos, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/875,928

(22) Filed: Sep. 3, 2010

(65) Prior Publication Data
US 2011/0057726 A1 Mar. 10, 2011

(30) Foreign Application Priority Data

Sep. 7, 2009 (EP) .................................... 09252142

(51) Int. Cl.
H03F 3/38 (2006.01)
(52) U.S. Cl. ........................ 330/10; 330/251; 330/207 A
(58) Field of Classification Search ................ 330/10, 330/251, 207 A
See application file for complete search history.

(56) References Cited

U.S. PATENT DOCUMENTS

| 3,919,656 | A | | 11/1975 | Sokal et al. | |
|---|---|---|---|---|---|
| 5,063,332 | A | * | 11/1991 | El-Hamamsy et al. | 315/48 |
| 5,187,580 | A | * | 2/1993 | Porter et al. | 330/207 A |
| 6,888,403 | B2 | * | 5/2005 | Cho et al. | 330/10 |
| 7,202,747 | B2 | * | 4/2007 | Forse et al. | 330/305 |
| 7,352,237 | B2 | * | 4/2008 | Snelgrove et al. | 330/10 |
| 7,714,649 | B1 | * | 5/2010 | Cripe | 330/251 |

FOREIGN PATENT DOCUMENTS

WO 01/03288 A1 1/2001

OTHER PUBLICATIONS

Sokal, N. et al. "Class E, a New Class of High-Efficiency Tuned Single-Ended Power Amplifiers," IEEE J. Solid State Circuits, vol. SC-10, pp. 168-176 (Jun. 1975).
Zirath, H. et al. "An LDMOS VHF Class-E Power Amplifier Using a High Q Novel Variable Inductor," IEEE Trans. on Microwave Theory and Techniques, vol. 47, No. 12, pp. 2534-2538 (Dec. 1999).
D. Aksin, et al. "High-Efficiency Power Amplifier for Wireless Sensor Networks," IEEE, pp. 5898-5901, (May 23, 2005).
M. Acar, et al. "Analytical Design Equations for Class-E Power Amplifiers," IEEE Trans. on Circuits and Systems—I: Regular Papers, vol. 54, No. 12, pp. 2706-2717, (Dec. 2007).
Extended European Search Report for European patent appln. No. 09252142.6 (Feb. 12, 2010).

* cited by examiner

Primary Examiner — Patricia Nguyen

(57) ABSTRACT

A switching amplifier (200; 300; 400; 500) comprising: a switch (202; 302) configured to electrically connect and disconnect a first pin (202a; 302a) of the switch (202; 302) to a second pin (202b; 302b) of the switch (202; 302) in accordance with a pulse width modulated input signal (216; 316; 516). The second pin (202b; 302b) is connected to a ground connector (204; 304). The switching amplifier also comprises a feed inductor (206; 306; 406) connected between a voltage supply connector (208; 308) and the first pin (202a; 302a) of the switch (202; 302), and a circuit (210; 310; 522) comprising a variable component having a variable imaginary impedance. The circuit (210; 310; 522) is connected between the first pin (202a; 302a) of the switch (202; 302) and an output connector of the amplifier (212; 312). The switching amplifier further comprising a controller (214; 314; 514) configured to generate a control signal (315; 515) for the circuit (210; 310; 522) such that the variable component of the circuit is adjustable in accordance with the duty cycle of the pulse width modulated input signal (216; 316; 516).

15 Claims, 8 Drawing Sheets

Figure 6b

| Δ | Pout 1 | η 1 | Pout 1.5 | η 1.5 | Pout 2.1 | η 2.1 | Pout 3 | η 3 | Pout 3.6 | η 3.6 | Pout 4.2 | η 4.2 | Pout 5 | η 5 |
|---|---|---|---|---|---|---|---|---|---|---|---|---|---|---|
| 0.55 | 42.43 | 53.68 | 42.31 | 64.15 | 41.36 | 72.26 | 39.29 | 61.38 | 37.92 | 47.95 | 36.69 | 36.29 | 35.26 | 25.13 |
| 0.5 | 42.38 | 58.01 | 42.4 | 70.03 | 41.22 | 78.8 | 38.96 | 71.58 | 37.55 | 57.53 | 36.31 | 43.76 | 34.88 | 29.96 |
| 0.45 | 42 | 59.35 | 42.4 | 74.3 | 41.08 | 82.98 | 38.58 | 80.97 | 37.11 | 67.82 | 35.86 | 52.13 | 34.43 | 35.22 |
| 0.4 | 41.41 | 58.57 | 42.28 | 76.7 | 40.98 | 85.11 | 38.25 | 86.59 | 36.7 | 75.91 | 35.43 | 59.34 | 34.02 | 39.72 |
| 0.35 | 40.58 | 55.9 | 41.86 | 76.12 | 40.88 | 86.59 | 37.99 | 89.27 | 36.34 | 81.38 | 35.04 | 64.97 | 33.65 | 43.23 |
| 0.3 | 39.42 | 51.19 | 40.81 | 70.1 | 40.62 | 86.34 | 37.76 | 90.42 | 36.01 | 84.89 | 34.66 | 69.23 | 33.3 | 45.85 |
| 0.25 | 37.87 | 44.66 | 39.13 | 60.11 | 39.95 | 82.16 | 37.5 | 90.37 | 35.66 | 86.72 | 34.28 | 72.12 | 32.96 | 47.57 |
| 0.2 | 35.95 | 37.11 | 37.09 | 49.2 | 38.42 | 71.02 | 37.09 | 88.61 | 35.26 | 86.76 | 33.87 | 73.4 | 32.69 | 48.37 |
| 0.15 | 33.49 | 28.73 | 34.57 | 37.79 | 35.97 | 54.93 | 36.33 | 83.2 | 34.73 | 84.6 | 33.45 | 73.03 | 32.66 | 48.83 |
| 0.1 | 29.4 | 18.35 | 30.51 | 24.2 | 31.92 | 35.09 | 34.07 | 65.48 | 33.81 | 78.3 | 32.99 | 70.97 | 32.02 | 46.76 |
| 0.05 | 17.92 | 5.01 | 19.15 | 6.7 | 20.81 | 9.97 | 23.53 | 19.84 | 24.98 | 29.97 | 25.1 | 33.11 | 23.48 | 21.65 |

| freq | Pout 0.5 | Pout 0.1 |
|---|---|---|
| 2 | 38.36 | 32.66 |
| 2.1 | 39.52 | 33.79 |
| 2.2 | 40.74 | 34.41 |
| 2.3 | 42.2 | 33.53 |
| 2.4 | 42.39 | 32.95 |
| 2.5 | 41.4 | 32.1 |
| 2.6 | 40.1 | 30.74 |
| 2.7 | 38.81 | 29.32 |
| 2.8 | 37.65 | 27.97 |
| 2.9 | 36.63 | 26.72 |
| 3 | 35.73 | 25.51 |

SWITCHING AMPLIFIER

This application claims the priority under 35 U.S.C. §119 of European patent application no. 09252142.6, filed on Sep. 7, 2009, the contents of which are incorporated by reference herein.

FIELD OF THE INVENTION

The present disclosure relates to the field of switching amplifiers, and methods of operating switching amplifiers.

BACKGROUND OF THE INVENTION

Switching amplifiers, including switched mode power amplifiers (SMPA), are known. One type of switching amplifier is a "Class E" amplifier, which is a highly efficient switching power amplifier. FIG. 1 shows a prior art single-ended Class E power amplifier. Use of a Class-E power amplifier is described in "Class E, a new class of high-efficiency tuned single-ended power amplifiers" (IEEE Journal Solid State Circuits, Vol SC-10, June 1975, pages 168 to 176)

Use of a Class E power amplifier is described in "An LDMOS VHF Class-E Power Amplifier Using a High-Q Novel Variable Inductor" (IEEE Transactions on Microwave Theory and Techniques, Vol. 47, No. 12, December 1999, pages 2534 to 2538). In this paper, a concept of the output network and the usage of the newly developed silicon LDMOS device make it possible to achieve a record-high output power of 54 W with a comparatively high efficiency of 70% at a frequency of 144 MHz.

Further uses of Class E power amplifiers are disclosed in "Analytical Design Equations for Class-E Power Amplifiers" (IEEE Transactions on Circuits and Systems-I: Regular Papers, Vol. 54, No. 12, December 2007, pages 2706 to 2717). This paper presents an analytical solution for the ideal Class-E PA, showing the relation between the circuit elements and the input parameters. The solution reveals the existence of infinitely many design equations for the ideal Class-E PA due to freedom in the value of the DC-feed inductor and in the switch duty-cycle. Based on the analytical solution a coherent, non-iterative, procedure for choosing the circuit design elements is presented.

The listing or discussion of a prior-published document or any background in this specification should not necessarily be taken as an acknowledgement that the document or background is part of the state of the art or is common general knowledge.

OBJECT OF THE INVENTION

It is an object of the invention to address one or more problems associated with the prior art.

SUMMARY OF THE INVENTION

According to a first aspect of the invention, there is provided a switching amplifier comprising:

a switch configured to electrically connect and disconnect a first pin of the switch to a second pin of the switch in accordance with a pulse width modulated input signal, wherein the second pin is connected to a ground connector;

a feed inductor connected between a voltage supply connector and the first pin of the switch;

a circuit comprising a variable component having a variable imaginary impedance, the circuit connected between the first pin of the switch and an output connector of the amplifier, and a controller configured to generate a control signal for the circuit such that the variable component of the circuit is adjustable in accordance with the duty cycle of the pulse width modulated input signal.

It will be appreciated that an imaginary impedance is a term known in the art that relates to a part of an impedance that is expressed as having a mathematical real and imaginary component. Such mathematics can be used to consider component performance at different frequencies.

Use of such a controller and variable component can enable the imaginary impedance of the variable component to be adjustable in accordance with the duty cycle of the pulse width modulation (PWM) input signal in order to improve the efficiency of the amplifier. That is, the imaginary impedance value of the variable component can be automatically/dynamically adjusted in order to improve the performance of the amplifier over a range of operating conditions. In this way, a component value of the circuit can be dynamically tuned for the specific characteristics of the PWM input signal The circuit comprising the variable component can be considered as being in series with a load, when a load is connected to the output connector of the amplifier. In some embodiments, the circuit may be considered as an output circuit, possibly an output matching circuit.

It will be appreciated that a connector can be any port that enables the amplifier to receive or transmit signalling from or to a third party device. The third party device may be external to an integrated circuit that embodies the switching amplifier or may be embodied on the same integrated circuit. Also, any connection or coupling between components or ports can include both direct and indirect connections/couplings. For example, additional components may be included in circuits or amplifiers of the invention that do not prevent other components from performing their required functionality.

The variable component may comprise a variable capacitor, which may have a control range of the order of 1:3. It is known that a capacitor provides an impedance with an imaginary component when exposed to an alternating current (AC), and therefore is a suitable component to provide a variable imaginary impedance. Furthermore, variable capacitors having a control range of the order of 1:3, that is $C_{max}/C_{min}$ is of the order of 3, may be readily available and therefore can be considered as providing a convenient, inexpensive satisfactory implementation of an embodiment of the invention. In addition, such a control range can provide an amplifier with a good performance over a range of duty cycles and/or frequencies of operation.

The variable component may comprise a variable inductor. The variable inductor may be in addition to the variable capacitor, or instead of the variable capacitor. The variable inductor may be a micro-electro-mechanical systems MEMS component.

The switching amplifier may further comprise a second circuit comprising a harmonic filter inductor and a harmonic filter capacitor. The second circuit may be connected in series between the circuit and the output connector. In this way, the second circuit can be used to filter out any harmonic signals at frequencies that are not required as part of the output of the switching amplifier.

A resistive load may be connected between the output connector and ground. In some embodiments, a variation in the resistive load may not be capable of improving the efficiency of the switching amplifier as the imaginary component of the impedance of the load may not be adjustable by a resistive load. This is because a resistive load comprises only a real component of impedance.

The switch may be a field effect transistor, or any other type of transistor. The first pin of the switch may be the drain of the field effect transistor, the second pin of the switch may be the source of the field effect transistor, and the gate of the field effect transistor may be configured to receive the pulse width modulated input signal.

The switch may be a bipolar junction transistor. The first pin of the switch may be the collector of the bipolar junction transistor. The second pin of the switch may be the emitter of the bipolar junction transistor, and the base of the bipolar junction transistor may be configured to receive the pulse width modulated input signal.

The feed inductor may be a finite feed inductor, or may be an infinite feed inductor. In some embodiments, the controller may be configured to adjust the variable component differently depending upon whether the feed inductor is a finite inductor or an infinite inductor.

The switching amplifier may be a Class E amplifier. Class E amplifiers can make use of the output parasitic capacitance of a transistor, which can be seen as hampering other amplifier classes like Class D and Class F.

The switching amplifier may be a radio frequency switched mode power amplifier (SMPA). Embodiments of the invention may address issues that are only relevant to radio frequency (RF) amplifiers. For example, imaginary impedance may not be relevant for DC to DC converters that do not operate at RF frequencies. One or more embodiments may relate to operation at high frequencies, for example, of the order of Gigahertz.

The controller may comprise a low pass filter. A low pass filter can process the PWM input signal in order to provide a direct current (DC) or intermediate frequency signal representative of the duty cycle of the PWM input signal.

There may be provided an integrated circuit comprising any switching amplifier disclosed herein. Any connector of the switching amplifier may be a pin of the integrated circuit.

There may be provided a device comprising any power amplifier disclosed herein. The device may be an electronic telecommunications device, such as a cellular base station, a cellular mobile terminal such as a handset, any other broadcast application device, or any other electronic device that can comprise a switching amplifier, as non-limiting examples. Other example devices can include Radar, industrial heating, and plasma generation, such as for lighting applications.

According to a further aspect of the invention, there is provided a method of operating any switching amplifier disclosed herein, the method comprising:
  receiving a pulse width modulated input signal; and
  adjusting the component value of the variable component of the circuit in accordance with the duty cycle of the pulse width modulated input signal.

According to a further aspect of the invention there is provided a computer program, which when run on a computer, causes the computer to configure any apparatus, including a component, amplifier, device or circuit, disclosed herein, or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium such as a disc or a memory device, or may be embodied as a transient signal. Such a transient signal may be a network download, including an internet download.

In this way, the performance, including the efficiency, can be adjusted in real-time in accordance with the instantaneous characteristics of the PWM input signal.

BRIEF DESCRIPTION OF THE DRAWINGS

A description is now given, by way of example only, with reference to the accompanying drawings, in which.

DESCRIPTION OF THE EMBODIMENTS

One or more embodiments described herein relate to a switching amplifier having a circuit between the switch and an output connector of the amplifier. The circuit has a variable component with a variable imaginary impedance that can be adjusted in accordance with the duty cycle of a pulse width modulated (PWM) input signal received at the switching amplifier. In this way, the component value of the variable component can be adjusted/tuned in order to provide an efficient switching amplifier for a variety of duty cycle values. This may be in contrast to the prior art wherein the values for all components associated with a switching amplifier, including those that provide an imaginary impedance, are pre-set for a specific duty cycle, and any variation in the duty cycle used to calculate the component values can lead to a reduced efficiency of operation.

Further advantages associated with one or more embodiments of the invention can include the provision of an amplifier that can be reconfigured for different frequency bands, and still provide efficient operation. Also, use of a variable capacitor (varactor) to provide the variable imaginary impedance can be advantageous. The amplifier can be less sensitive to a series resistance of the variable capacitor, and a variable capacitor with a control range of 1:3 may be considered as providing sufficient control for the power amplifier. Such variable capacitors may be readily available and inexpensive, whilst still providing acceptable performance.

Figure 1:
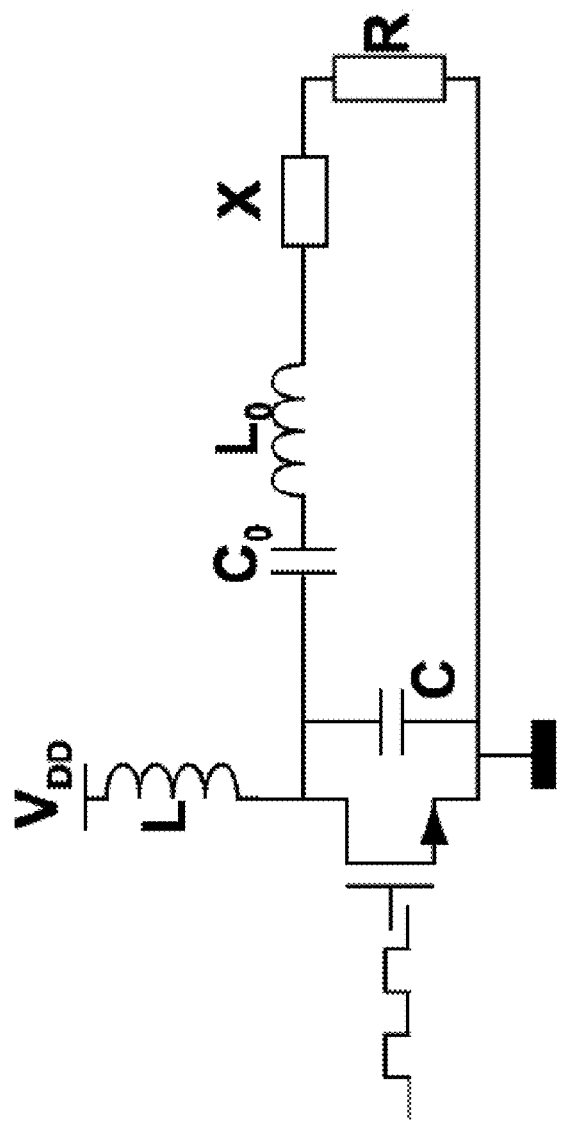
FIG. 1 illustrates a prior art single-ended Class E power amplifier.
Figure 2:
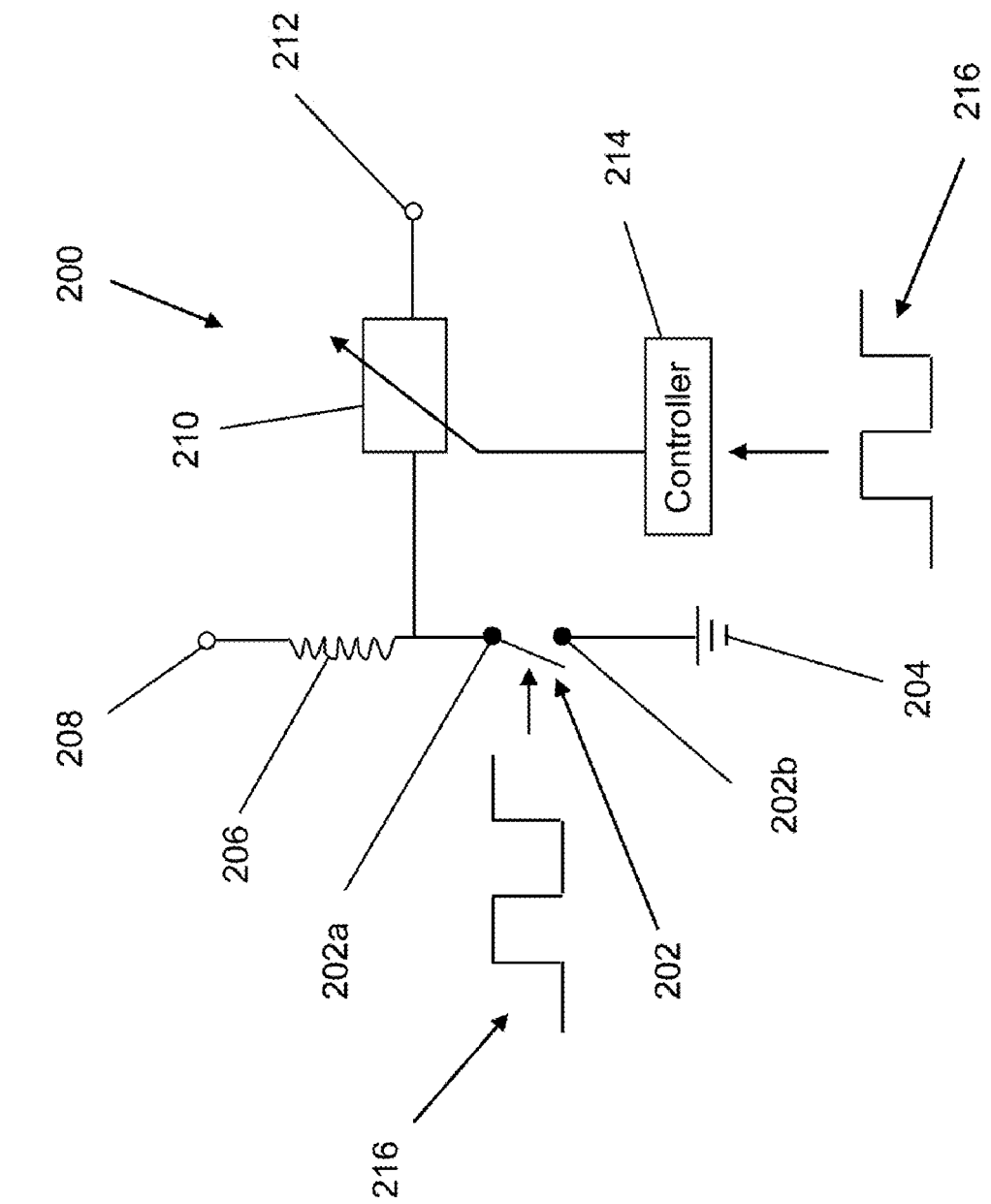
FIG. 2 illustrates a power amplifier according to an embodiment of the invention.

FIG. 2 illustrates switching amplifier 200 according to an embodiment of the invention.

The switching amplifier 200 comprises a switch 202 having a first pin 202a and a second pin 202b. The switch 202 is operable in accordance with a received pulse width modulated (PWM) input signal 216. The second pin 202b is connected to ground 204 and the first pin 202a is connected to a first pin of a feed inductor 206. The other pin of the feed inductor 206 is connected to a voltage supply connector 208 that is configured to receive a supply voltage when the switching amplifier 200 is in use. It will be appreciated that the voltage supply connector 208 could be a pin on an integrated circuit for example, or any other connector that can receive a supply voltage.

The first pin 202a of the switch 202 is also connected to a circuit 210 that has a variable component. The circuit can be considered as an output circuit, possibly an output matching circuit. The variable component has an adjustable/variable imaginary impedance, and can be a variable capacitor and/or variable inductor as described in more detail below. The circuit 210 is also coupled to an output connector 212, which again can be any suitable connector for coupling the amplifier 200 to a load (not shown).

It will be appreciated that an imaginary impedance is a term known in the art that relates to a part of an impedance that is expressed as having a mathematical real and imaginary component.

As is known in the art, the impedance of a capacitor is: $Z_C=1/j\omega C$, and impedance of an inductor is: $Z_L=j\omega L$. It can be seen that the imaginary impedance of an inductor and capacitor is changed as the inductance and capacitance component values changes.

The switching amplifier 200 also includes a controller 214 that can generate a control signal for the circuit 210 such that the variable component of the circuit 210 is adjustable in accordance with the duty cycle of the pulse width modulated input signal 216. The same pulse width modulated input signal 216 is used to control operation of the switch 202 and also to control the variable component having a variable imaginary impedance of the circuit 210.

The variable component of the circuit 210 can be adjusted in order to maintain a good efficiency of the amplifier 200 over a large dynamic range of output powers. That is, the value of the variable component can be adjusted in accordance with the duty cycle of the PWM input signal 216, which is indicative of the output power of the amplifier 200.

Modulating the pulse width of a signal provided to a Class E power amplifier is a known way to control the output power of the amplifier. The shorter the pulse width, the shorter the time the switch in the amplifier is open, the lower the output power. A disadvantage of this control mechanism in the prior art can be a low power efficiency of the amplifier at powers lower than maximum. By changing the value of the series inductor in accordance with an embodiment of the invention, the efficiency can be kept at high levels over a large dynamic range of output powers. Simulations show theoretical efficiencies above 95% over a 16 dB dynamic range. The realization can be provided by a variable capacitor being used in series with the series inductor.

An example of the requirements on the variable capacitor (varicap) for its control range are 1:3. This can mean that commercially available varicaps can be used, giving embodiments of the invention both a large impact on amplifier performance and a low complexity of realization. Another implementation can be provided by using MEMS variable inductors to provide the variable imaginary impedance.

Figure 3:
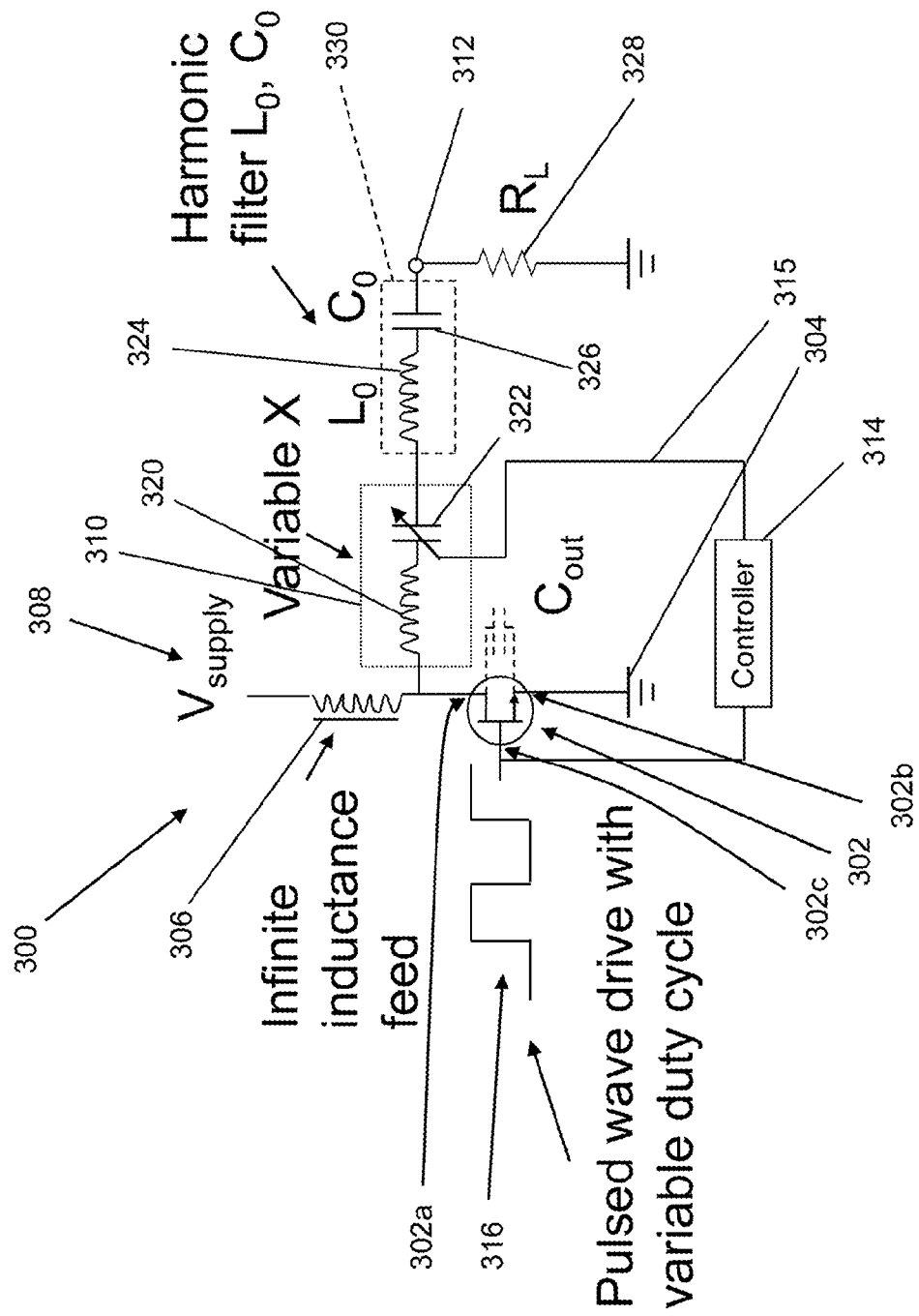
FIG. 3 illustrates a power amplifier according to another embodiment of the invention.

FIG. 3 illustrates another embodiment of a switching amplifier 300 according to the invention. In this embodiment, the switch of the switching amplifier 300 is a field effect transistor (FET) 302. The source 302b of the FET 302, which is an example of a second pin of a switch, is connected to ground 304. The drain 302a of the FET 302, which is an example of a first pin of a switch, is connected to an infinite inductance feed 306, which in turn is connected to a supply voltage 308.

The gate 302c of the FET 302 receives the pulse width modulated input signal, which has a variable duty cycle in order to control the output power of the amplifier.

The drain 302a of the FET 302 is also connected to a first circuit 310. In this example, the circuit 310 comprises an inductor 320 and variable capacitor 322 in series. The purpose of the circuit 310 is to provide a variable imaginary impedance, and it will be appreciated that a variable inductor could be used instead of, or as well as, the variable capacitor 322.

The pulse width modulated input signal 316 is also provided as an input to a controller 314. The controller 314 is configured to process the input signal 316 and generate a control signal 315 for controlling the capacitance value of the variable capacitor 322. The control signal 315 is indicative of how the capacitance value of the variable capacitor 322 should be adjusted in order to provide an efficient switching amplifier 300. As indicated above, the imaginary impedance of a capacitor is inversely proportional to its capacitance value. For example, the control signal 315 may cause the capacitance value of the variable capacitor 322 to increase when the duty cycle of the PWM input signal 316 decreases, and vice versa.

As described above, use of the variable capacitor 322 can enable an efficient switching amplifier 300 to be provided over a range of duty cycle values. The adjustment in the value of the variable capacitor 322 can be automatic in accordance with the control signal 315.

In this example, a second circuit 330 is provided in series between the first circuit 310 and an output connector 312 of the switching amplifier 300. The second circuit 330 comprises a further inductor 324 and capacitor 326 in series in order to provide a harmonic filter for the output of the amplifier 300. The values for the inductor 324 and capacitor 326 ($L_o, C_o$) can be selected to filter out any harmonic frequencies that are likely to be present in the output signalling of the amplifier 300.

As shown in the circuit diagram of FIG. 3, a load resistor 328 is connected between the output connector 312 of the amplifier 300 and ground. The first circuit 310 and second circuit 330 are in series with the load resistor 328.

For the implementation shown in FIG. 3, having an infinite feed inductance, Cout can be given (transistor output capacitance), and X and RL can be design parameters for a certain frequency and duty cycle. By making X dynamically variable, the circuit can always be optimized for any duty cycle, and the circuit can also be optimized to work at other frequencies.

It will be appreciated that in other embodiments, the switch could be a bipolar junction transistor (BJT) instead of a field effect transistor (FET), or any other component that can provide the required switching functionality.

Figure 4:
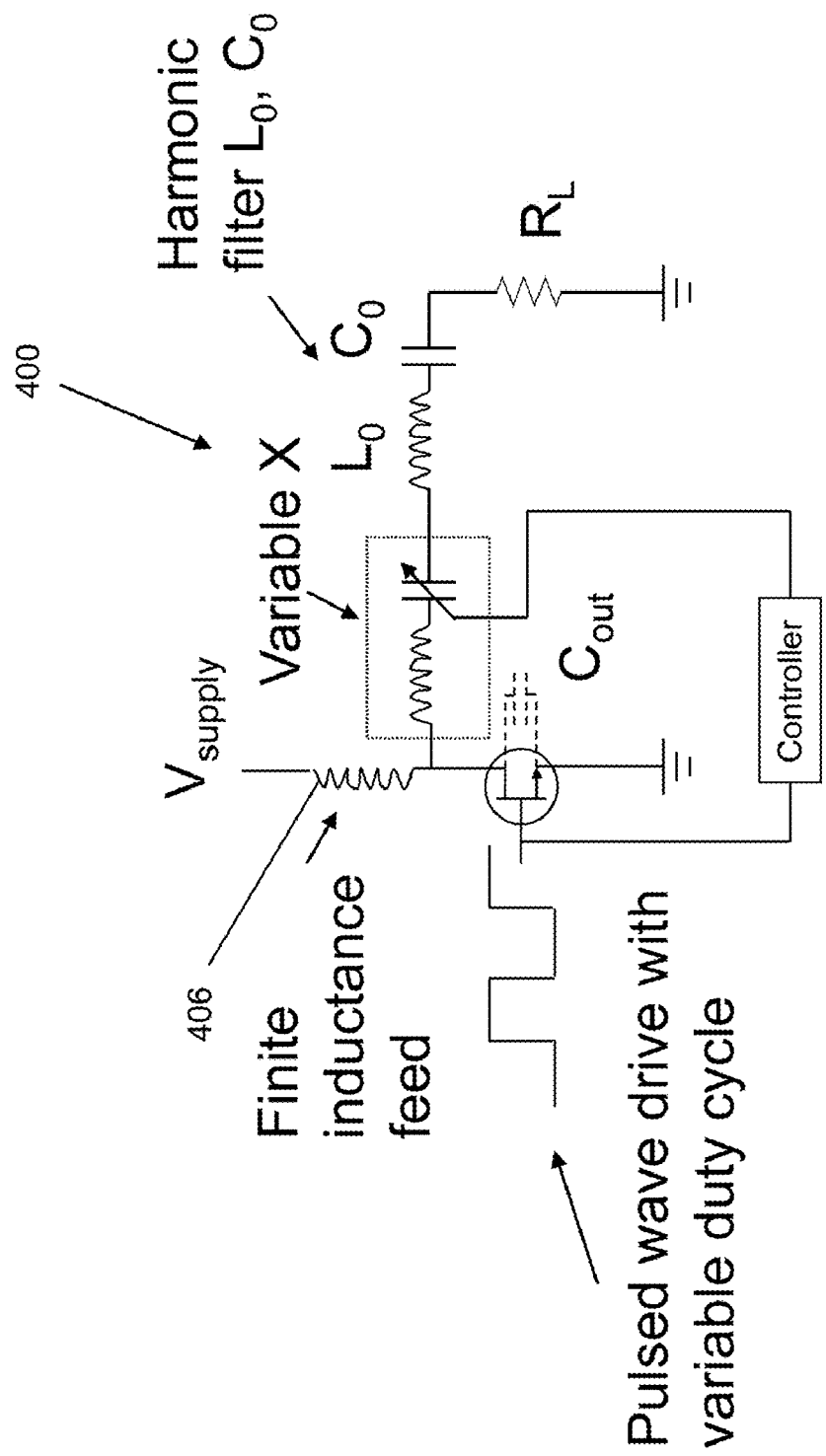
FIG. 4 illustrates a power amplifier according a further embodiment of the invention.

FIG. 4 illustrates a power amplifier 400 according to a further embodiment of the invention. The switching amplifier 400 of FIG. 4 is very similar to the switching amplifier 300 of FIG. 3, except that the inductance feed 406 of FIG. 4 is finite, whereas the inductance feed 306 of FIG. 3 is infinite.

It will be appreciated to those skilled in the art that different design parameters and component values may be required for a finite inductance feed amplifier 400. Therefore, the capacitance value of the variable capacitor may need to be controlled differently to the variable capacitor of FIG. 3. However, the advantages associated with embodiments of the invention of improving the efficiency of the amplifier for a range of duty cycles of the PWM input signal by providing a variable component as described above, can be achieved equally for amplifiers having a finite inductance feed 406 and an infinite inductance feed.

For the implementation of FIG. 4, having a finite feed inductance, Cout can be given (transistor output capacitance), and X and RL can be design parameters for certain frequency and duty cycle. The design values for X and RL can be different from those for the implementation of FIG. 3, which relates to an infinite feed inductance. The circuit of FIG. 4 may be capable of operating at higher frequencies than the circuit of FIG. 3.

Figure 5:
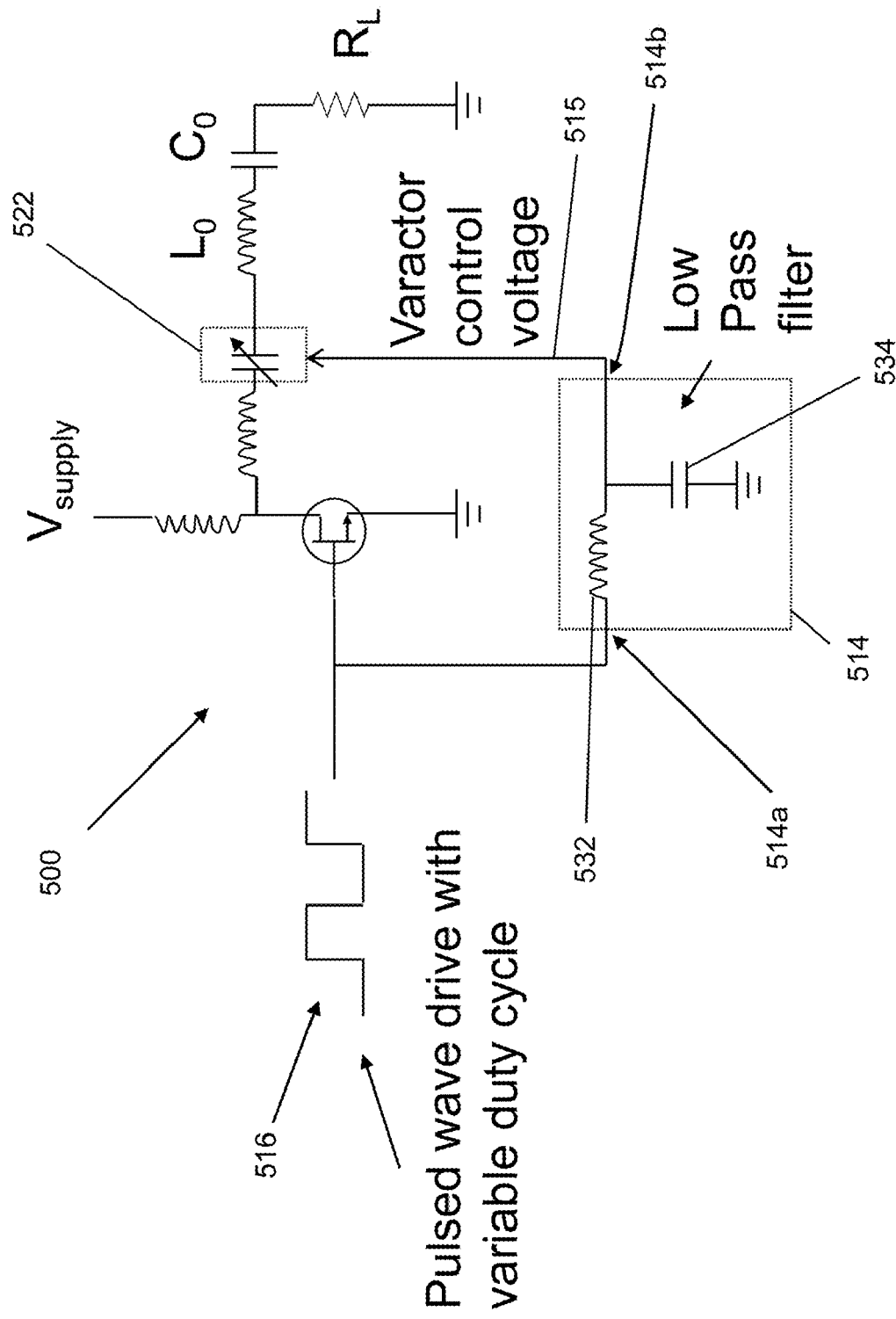
FIG. 5 illustrates a power amplifier according to a further still embodiment of the invention.

FIG. 5 illustrates a further embodiment of a switching amplifier 500 according to an embodiment of the invention. The switching amplifier 500 is similar to those of FIG. 3 and FIG. 4, and further details of the controller 514 are provided.

In this example, the controller 514 is a low pass filter. The low pass filter 514 is used to generate a direct current (DC) representation of the duty cycle of the PWM input signal 516. The low pass filter 514 has an input pin 514a and an output pin 514b. The PWM input signal 516 is received at input pin 514a, which is connected to a first pin of an inductor 532. The second pin of the inductor 532 is connected to ground by a capacitor 534 and also to the output pin 514b of the low pass filter. In this way, a varactor control signal/voltage 515 is provided as the output of the low pass filter 514 in order to control the value of the varactor 522.

It will be appreciated that the controller 514 can comprise any components that are capable of generating a varactor control signal 515 representative of the duty cycle of the PWM input signal 516, and that a low pass filter is only one example of suitable components for providing the control signal 515.

Possible implementations for varactor control can include deriving a slow varying (IF) signal from the PWM signal, wherein the IF signal is proportional to the duty cycle of the PWM signal, and can be used to control the varactor capacitance value.

Figure 6A:
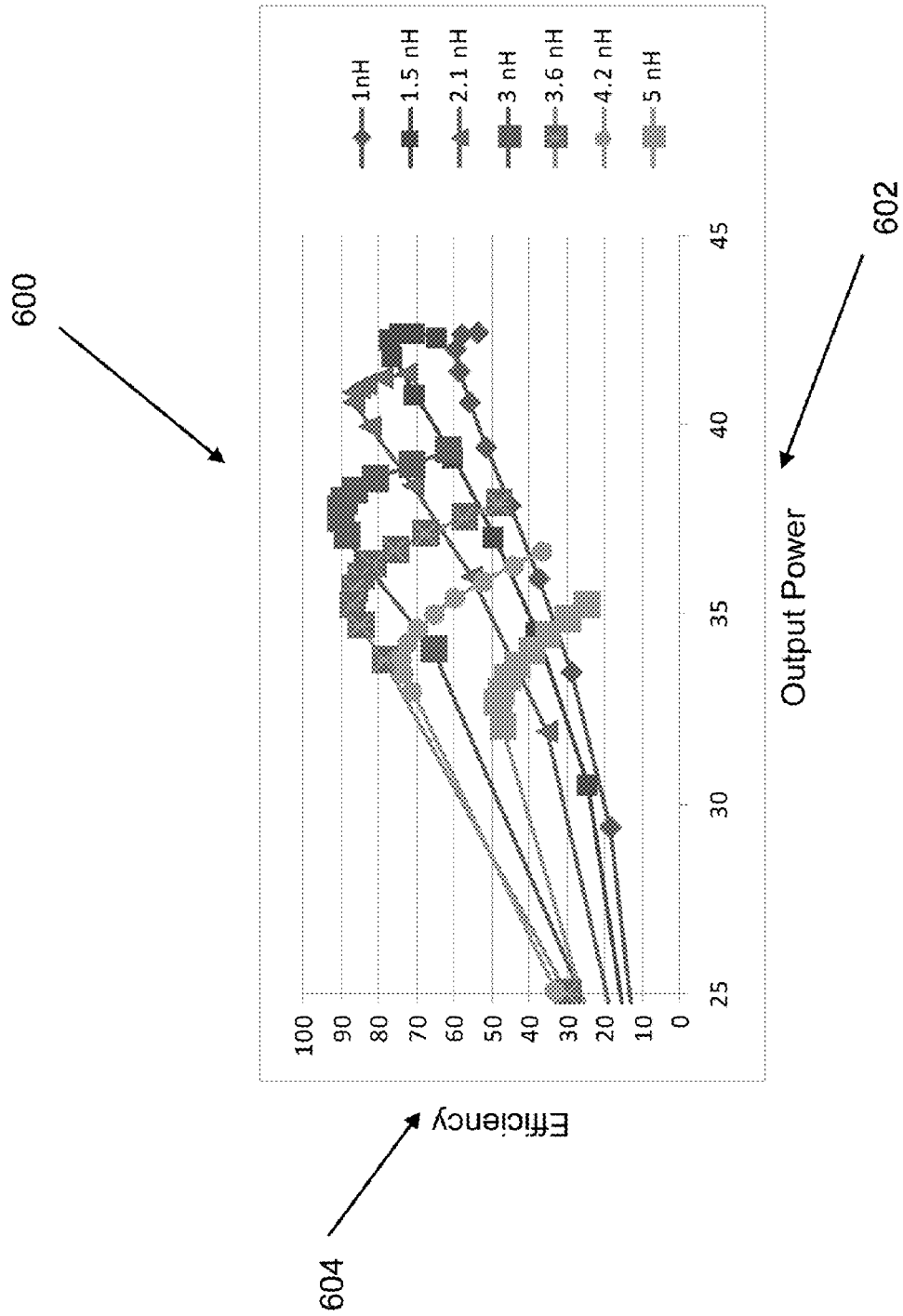
FIGS. 6 and 7 illustrate graphically the performance of a power amplifier according to an embodiment of the invention.

FIG. 6a illustrates graphically the efficiency and output power of the switching amplifier according to an embodiment of the invention. The data are from a simulated Class-E power amplifier using a 20 W GaN transistor as the switch. The efficiency 604 and output power 602 are shown for power amplifiers having a range of inductance values, and hence a range of corresponding imaginary impedance values. In this example, results are shown for a circuit wherein a variable inductor is provided in series with the output load in order to be able to adjust the imaginary impedance of a circuit provided between the switch and output of the amplifier.

The table of data that was used to generate the graph of FIG. 6a is provided as FIG. 6b. The symbol Δ represents duty cycle, where a value of Δ=1 represents a signal that is always high and a value of Δ=0 represents a signal that is always low; "Pout n" represents the output power in dBm for a circuit with an inductance value of n, where the power has been calculated for circuits where n is given a number of values in order to illustrate how adjusting the impedance value, and hence the imaginary impedance of the inductor, affects efficiency; and "η n" represents the efficiency of the circuit with an inductance value n.

The output power 602 is illustrated on the horizontal axis of FIG. 6a and the efficiency 604 is illustrated on the vertical axis. It will be appreciated, and can be seen from the data shown in FIG. 6b, that the output power is representative of the duty cycle of the PWM input signal. That is, as the duty cycle decreases below 0.5, the PWM input signal is low for longer than it is high, and therefore the output power decreases. As can be seen from FIG. 6a, for a required output power, and hence for an associated duty cycle, use of the different inductance values as shown by the separate lines on the graph 600 provide different efficiencies.

As an example, if an output power of about 37.5 dBm is required, then an inductance value of about 3 nH should be used to provide an efficiency of about 90%. This is in contrast to the efficiency that is attainable using an inductor with a value of 2.1 nH wherein the efficiency is about 65%, or an inductor with a value of 3.6 nH wherein the efficiency is about 55%.

It will be appreciated that for a given required output power, different inductor values provide different efficiencies, and therefore one or more embodiments described herein can enable an optimal inductance value to be used in order to provide optimal, or at least improved, efficiency of the amplifier for a specific output power/duty cycle.

Figures 7A, 7B:
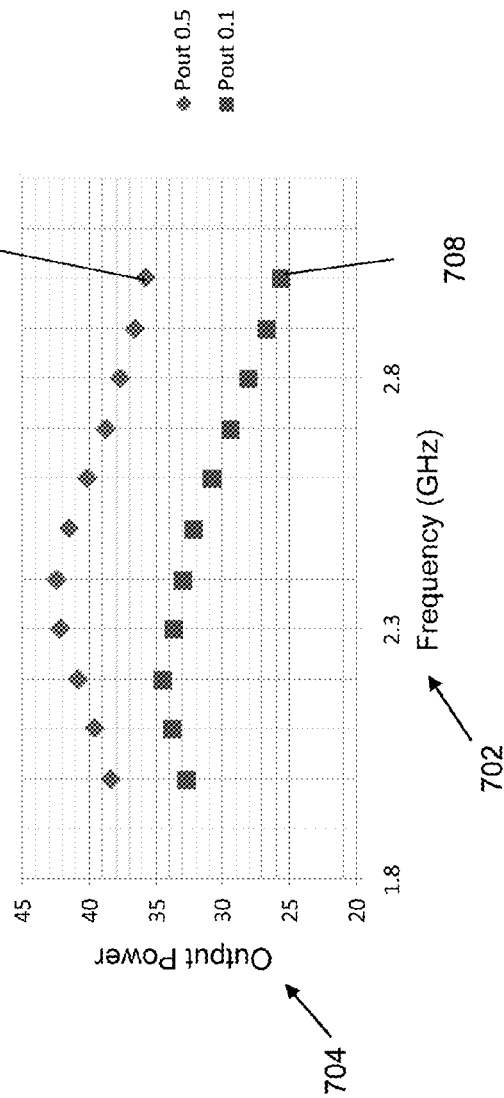

FIG. 7a illustrates graphically the performance of a power amplifier according to an embodiment of the invention in terms of output power, for a range of frequencies of operation. FIG. 7b shows the data that was used to provide the graph of FIG. 7a.

FIG. 7 illustrates how the output power 704 varies with frequency 702 for a power amplifier with a duty cycle of 0.5 (as illustrated with diamonds 706) and a power amplifier with a duty cycle of 0.1 (as shown with squares 708). The component value for the variable component has been pre-selected in accordance with the data illustrated at FIG. 6 or similar data, that is, the variable component value is optimised for use at 2.4 GHz in both cases and is kept unchanged over frequency.

As can be seen from FIG. 7a, the output power for a given duty cycle and inductance value remains high over a range of frequencies.

FIG. 7 illustrates that embodiments of the invention can be useful for amplifying signals over a large range of frequencies of operation.

One or more embodiments described herein may be suitable for efficiently amplifying signals having a bandwidth of the order of 20 MHz, 40 MHz, 60 MHz, or even more.

An embodiment of the invention can be considered as providing a pulse-width modulated Class E power amplifier with a variable series inductor, having an inductance value that varies with the pulse width of the drive signal to enable high efficiency over a wide dynamic power range, and also enable frequency reconfigurability.

According to embodiments of the invention, a switch mode power amplifier (SMPA) can be used for generation of RF power with high efficiency, and can be operated in different frequency bands and with various modulation schemes, for example WiMax, WCDMA and GSM EDGE. Several types of SMPA classes can be used. Class E amplifiers can be advantageous because they make use of the output parasitic capacitance of the transistor, that can be considered as hampering other amplifier classes like Class D and Class F. Pulse Width Modulation (PWM) is a digital drive for SMPA's that enable amplitude and phase modulation in a digital transmitter. However, like other SMPA classes, Class E amplifiers may not operate with high efficiency when the signal pulse width differs from 50%. This can mean that high efficiency is only obtainable at maximum output power, that is when the pulse width is 50% of the period. At lower output power, the efficiency can rapidly decline.

Class E amplifiers according to embodiments of the invention can be tuned to work with high efficiency at shorter than 50% duty cycle by optimizing the passive component values in the output matching circuit. This can be done by changing the value of the series inductor in the output circuit. A solution is to use a varactor in series with the output inductor to change its effective inductance value at the main frequency. This variation of inductance can be performed dynamically, that is with a modulated signal at intermediate frequencies (IF), in accordance with varying the duty cycle at the same time, in such way that the amplifier has always close to ideal circuit values instantaneously for any given duty cycle. This can be performed such that negative voltages on the transistor output and/or negative currents through the transistor are limited or close to zero.

Furthermore, a tunable varactor in the output circuit can also be used to make the amplifier reconfigurable for use with different frequency bands. Hence, the solution of adding a varactor in the output circuit can enable both high efficiency over a large dynamic range of output powers as well as frequency agility. This SMPA can be used in a digital, multi-band transmitter.

Class E amplifier design can use two boundary conditions, Vdd, Cd and the duty cycle. The following values are then calculated: X=Im(Zload), R=Re(Zload), Pout and Idc. The efficiency can be calculated as 100% in the ideal case. It will be appreciated by the skilled person that there are several implementations, leading to different sets of equations, but that all are calculated according to these principles. If the duty cycle is varied to modulate the Pout, the equations are violated, which results in efficiency loss. Embodiments of the invention can be considered as being based upon: 1. ignore one or both boundary conditions; and 2. change X (reactance) in accordance with the duty cycle, such that the amplifier is always performing at very high efficiency.

In some embodiments, it can be advantageous to be able to change the reactance (X) by a factor of 8 for extremely high efficiency to be obtained over a 16 dB range of Pout. Varying other components (for example R or C) may not be able to improve the efficiency in this way, for example although varying C can improve the efficiency, this may be only over a much smaller dynamic range with lower efficiency. A dynamic range of 16 dB may be achievable with embodiments of the invention compared with a range of perhaps 10 dB that can be achieved when only varying C. Similarly, a minimum efficiency of 95% may be achievable when compared with 85% when only varying C. Furthermore, varying C may require C to be increased by providing a varactor in parallel with the output of the transistor. This can reduce the maximum operating frequency, which is undesirable. Also, varying the value of L may not limit the maximum frequency.

By using a varactor with a tuning range of only 3 in series in the output circuit can provide an achievable range in reactance with a factor of 8. Such a range of varactors can be commercially available. Furthermore by using a varactor this way, the amplifier can be reconfigurable for other frequency bands. Computer simulations with a Cree GaN transistor show that the bands from 2.1 up to 2.7 GHz can be covered with an efficiency of >70% over a 8 dB dynamic range by using a varactor with a control range of only 3. Therefore, an amplifier according to an embodiment of the invention can be reconfigurable for all bands between 2.1 and 2.7 GHz. The instantaneous +/−1 dB bandwidth of the power amplifier (PA) can be 250 MHz.

The range of values that are appropriate for a variable capacitor suitable for use with embodiments of the invention may be defined by (Cmax/Cmin), and can be a trade-off with breakdown voltage and quality factor (for example, series resistance). According to some embodiments, special varactors can be developed to achieve good results. Such varactors may not exist for RF power applications. Since known load modulation can only modify the real part of the load impedance, the prior art may not offer opportunities to reconfigure the amplifier for other frequency bands. Furthermore, by providing a varactor in series with the load, resistive losses can be limited as long as the series resistance of the varactor is much less than the real part of the load impedance. In the ADS simulations a load of 16 Ohms was used, which can mean that a varactor with a resistance of less than 1.6 Ohms may be considered as appropriate. This may be in contrast with conventional modulation of the real part of the load impedance by using varactors, whereby the series resistance of a varactor would need to be much less than 1 Ohm, typically 0.1 Ohm, to provide acceptable performance.

One or more embodiments of the invention can provide one or more of the following advantages: 1. a lower Cmax/Cmin ratio is needed than in conventional load modulation; 2. the amplifier is less sensitive to series resistance of the varactor; and 3. the amplifier can be reconfigured for other frequency bands

The invention claimed is:

1. A switching amplifier comprising:
a switch configured to electrically connect and disconnect a first pin of the switch to a second pin of the switch in accordance with a pulse width modulated input signal, wherein the second pin is connected to a ground connector;
a feed inductor connected between a voltage supply connector and the first pin of the switch;
a circuit comprising a variable component having a variable imaginary impedance, the circuit connected between the first pin of the switch and an output connector of the amplifier, and
a controller configured to automatically generate a control signal for the circuit such that the variable component of the circuit is automatically adjusted in accordance with the duty cycle of the pulse width modulated input signal.

2. The switching amplifier of claim 1, wherein the variable component comprises a variable capacitor, and the controller comprises a filter to facilitate generation of a control signal for the circuit.

3. The switching amplifier of claim 2, wherein the variable capacitor has a control range of 1:3.

4. The switching amplifier of any claim 1, wherein the variable component comprises a variable inductor, and the controller comprises a filter to facilitate generation of a control signal for the circuit.

5. A switching amplifier comprising:
a switch configured to electrically connect and disconnect a first pin of the switch to a second pin of the switch in accordance with a pulse width modulated input signal, wherein the second pin is connected to a ground connector;
a feed inductor connected between a voltage supply connector and the first pin of the switch;
a circuit comprising a variable component having a variable imaginary impedance, the circuit connected between the first pin of the switch and an output connector of the amplifier;
a controller configured to generate a control signal for the circuit such that the variable component of the circuit is adjustable in accordance with the duty cycle of the pulse width modulated input signal; and
a second circuit comprising a harmonic filter inductor and a harmonic filter capacitor, wherein the second circuit is connected in series between the circuit and the output connector.

6. The switching amplifier of claim 1, wherein the switch is a field effect transistor and the first pin of the switch is a drain of the field effect transistor, the second pin of the switch is a source of the field effect transistor, and a gate of the field effect transistor is configured to receive the pulse width modulated input signal.

7. The switching amplifier of claim 1, wherein the switch is a bipolar junction transistor and the first pin of the switch is a collector of the bipolar junction transistor, the second pin of the switch is an emitter of the bipolar junction transistor, and a base of the bipolar junction transistor is configured to receive the pulse width modulated input signal.

8. The switching amplifier of claim 1, wherein the switching amplifier is a radio frequency switched mode power amplifier.

9. The switching amplifier of claim 1, wherein the switching amplifier is a Class E amplifier.

10. A switching amplifier comprising:
- a switch configured to electrically connect and disconnect a first pin of the switch to a second pin of the switch in accordance with a pulse width modulated input signal, wherein the second pin is connected to a ground connector;
- a feed inductor connected between a voltage supply connector and the first pin of the switch;
- a circuit comprising a variable component having a variable imaginary impedance, the circuit connected between the first pin of the switch and an output connector of the amplifier, and
- a controller comprising a low pass filter, configured to generate a control signal for the circuit such that the variable component of the circuit is adjustable in accordance with the duty cycle of the pulse width modulated input signal.

11. A device comprising a power amplifier according to claim 1.

12. A method of operating the switching amplifier according to claim 1, the method comprising:
- receiving a pulse width modulated input signal; and
- adjusting a component value of the variable component of the circuit in accordance with the duty cycle of the pulse width modulated input signal.

13. A computer program, which when run on a computer, causes the computer to configure the amplifier of claim 1.

14. A computer program, which when run on a computer, causes the computer to configure the device of claim 11.

15. A computer program, which when run on a computer, causes the computer to perform the method of claim 12.

* * * * *